US008405961B2

(12) United States Patent
Dai

(10) Patent No.: US 8,405,961 B2
(45) **Date of Patent: *Mar. 26, 2013**

(54) KEYPAD ASSEMBLY AND ELECTRONIC DEVICE USING THE SAME

(75) Inventor: Bin Dai, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 87 days.

This patent is subject to a terminal disclaimer.

(21) Appl. No.: 12/953,758

(22) Filed: Nov. 24, 2010

(65) Prior Publication Data

US 2012/0039026 A1 Feb. 16, 2012

(30) Foreign Application Priority Data

Aug. 12, 2010 (CN) .......................... 2010 1 0251941

(51) Int. Cl.
*H05K 7/00* (2006.01)
*H01H 13/14* (2006.01)

(52) U.S. Cl. .............. 361/679.01; 361/679.02; 200/329; 200/341

(58) Field of Classification Search ............. 361/679.01, 361/679.02, 679.09, 679.36; 341/22; 345/156; 200/341, 344, 329
See application file for complete search history.

(56) References Cited

U.S. PATENT DOCUMENTS

| | | | | |
|---|---|---|---|---|
| 6,952,197 | B1 * | 10/2005 | Nakamura et al. | 345/157 |
| 2002/0033798 | A1 * | 3/2002 | Nakamura et al. | 345/156 |
| 2007/0235294 | A1 * | 10/2007 | Kang | 200/4 |
| 2007/0262954 | A1 * | 11/2007 | Na et al. | 345/156 |
| 2008/0068337 | A1 * | 3/2008 | Yim et al. | 345/160 |

* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

A keypad assembly includes a keypad, a fixing bracket, and at least one fixing member. The fixing member fixes the keypad to the fixing bracket, and the fixing bracket includes two support portions, a fixing portion, two connecting portions and at least two resilient portions. The resilient portions interconnect the support portions and the fixing portions. Opposite ends of each connecting portion interconnect the two support portions, such that the two connecting portions and the two support portions cooperatively form a frame. The fixing portion is located on a middle portion of the frame. The keycap is fixed on the fixing portion. The resilient portions elastically deform to provide elastic restoring force to the keycap.

15 Claims, 5 Drawing Sheets

KEYPAD ASSEMBLY AND ELECTRONIC DEVICE USING THE SAME

CROSS-REFERENCE TO RELATED APPLICATIONS

This application is related to two co-pending U.S. Patent Applications Ser. Nos. 12/944,924, 13/004,902), all entitled "KEYPAD ASSEMBLY AND ELECTRONIC DEVICE USING THE SAME", and the inventor is Bin Dai. The above-identified applications have the same assignee as the instant application and are concurrently filed herewith. The disclosures of the above-identified applications are incorporated herein by reference.

BACKGROUND

1. Technical Field

The present disclosure relates to data input, and particularly, to a keypad assembly used in an electronic device.

2. Description of the Related Art

Electronic devices often provide a keypad on a panel thereof, thus allowing control input for a power source or other components by the user.

A commonly-used keypad assembly is located on a housing of an electronic device. The housing defines a mounting port in a rear surface of the housing. The keypad assembly includes a keycap, a key switch, and an arched spring. The keycap is received in the mounting port, and a protrusion is arranged at a bottom of the keycap. The key switch includes a contact portion. The arched spring is sleeved on the protrusion and resists the housing. The protrusion resists a top of the spring. When the keycap is depressed, the spring is thereby elastically deformed, such that the protrusion depresses the contact portion. When the keycap is released, the spring returns to its relaxed state and resists the protrusion. However, the keypad assembly has a larger volume because of the protrusion and the spring.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
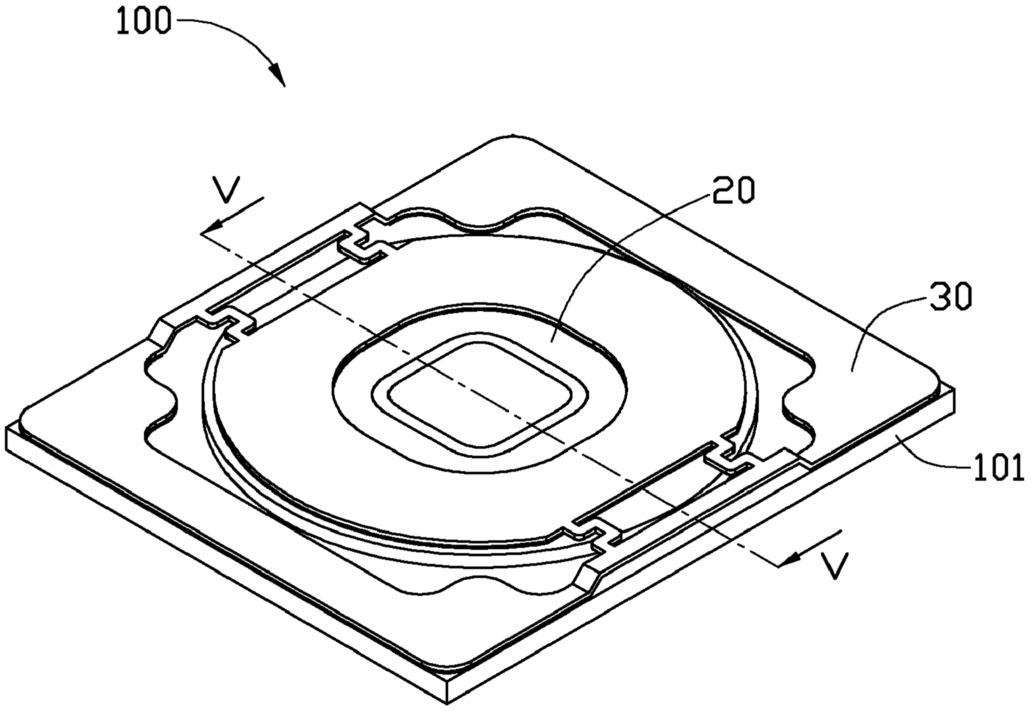
FIG. 1 is a partial, assembled, isometric view of one embodiment of an electronic device which includes a housing and a keypad assembly mounted on the housing, and the keypad assembly includes a fixing bracket and a keycap fixed on the fixing bracket.
Figure 2:
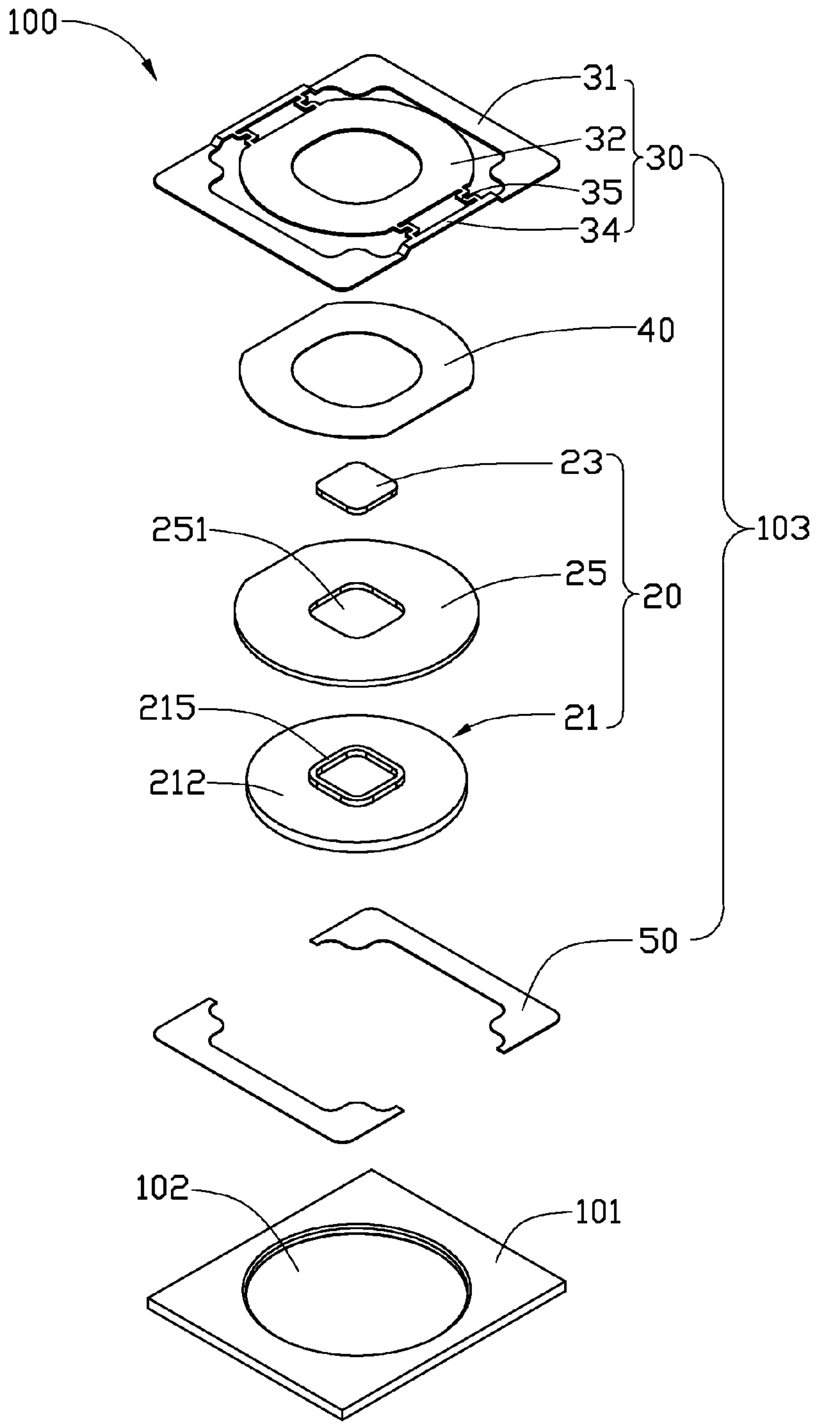
FIG. 2 is an exploded, isometric view of the electronic device shown in FIG. 1.
Figure 3:
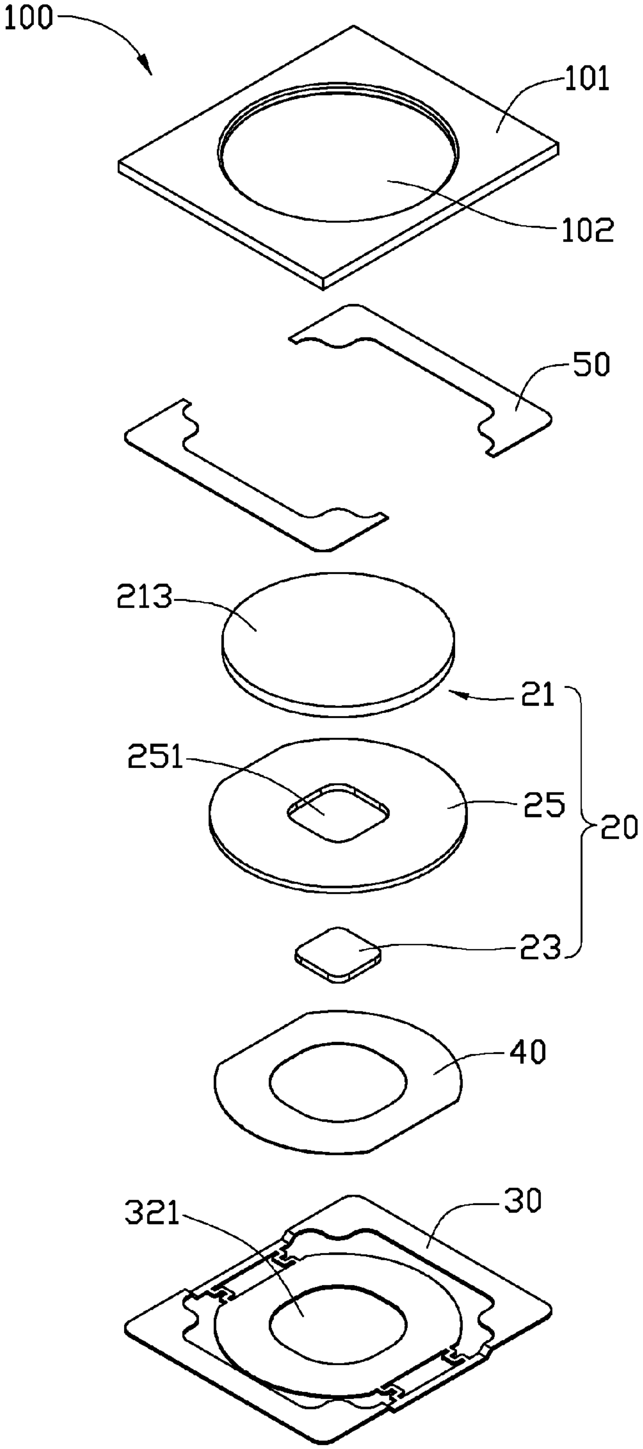
FIG. 3 is similar to FIG. 2, but viewed from another aspect.

Referring to FIGS. 1 through 3, an embodiment of an electronic device 100 includes a housing 101 and a keypad assembly 103 located on the housing 101. In the illustrated embodiment, the keypad assembly 103 is a main menu button and the housing 101 is a planar glass plate.

The keypad assembly 103 includes a keycap 20, a fixing bracket 30, a first fixing member 40, and a second fixing member 50. The first fixing member 40 fixes the keycap 20 to the fixing bracket 30. The second fixing member 50 fixes the fixing bracket 30 to the housing 101.

The keycap 20 includes a top cover 21, a filling portion 23, and a bottom cover 25. The top cover 21 includes an interface 212, a biasing surface 213 (see FIG. 3), and a receiving frame 215. The biasing surface 213 is defined in a side surface of the top cover 21 opposite to the interface 212. The receiving frame 215 is substantially rectangular and located on a middle portion of the interface 212. In the illustrated embodiment, the biasing surface 213 is a concave depression defined in a side surface of the top cover 21. The filling portion 23 is received in the receiving frame 215. The bottom cover 25 is substantially circular, and fixed on the interface 212. The bottom cover 25 defines a through hole 251 in a center thereof, and the through hole 251 is corresponding to the receiving frame 215. The top cover 21, the filling portion 23 and the bottom cover 25 are respectively different materials to optimize presentation and wear. In this embodiment, the filling portion 23 and the bottom cover 25 are black plastic. The top cover 21 is made of a transparent plastic resistant to wear, and integrally formed with the filling portion 23 and the bottom cover 25 by bi-color injection molding.

Figure 4:
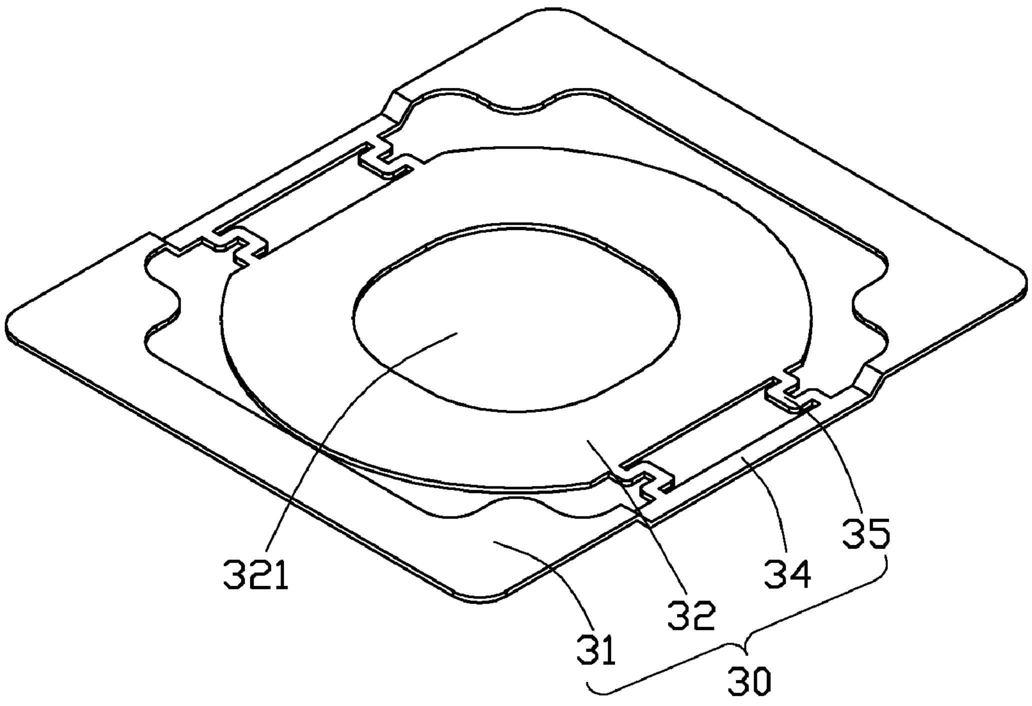
FIG. 4 is an isometric view of the fixing bracket shown in FIG. 1.

Referring to FIGS. 2 through 4, the fixing bracket 30 includes two support portions 31, a fixing portion 32, two connecting portions 34, and four resilient portions 35. Opposite ends of each connecting portion 34 are connected to the two support portions 31, such that the two support portions 31 and two connecting portions 34 cooperatively form a substantially rectangular frame. The four resilient portions 35 are all substantially cap-shaped, and symmetrically fixed on a periphery of the fixing portion 32. The fixing portion 32 is located on a middle portion of the substantially rectangular frame, and opposite sides of the fixing portion 32 are connected to a middle portion of the connecting portions 34 via the resilient portions 35. The fixing portion 32 defines a through hole 321 in the center thereof. In the illustrated embodiment, each connecting portion 34 is substantially U-shaped, such that the two support portions 31 and the connecting portion 34 cooperatively form two stepped portions, and the four resilient portions 35 protrude out from a planar surface of the support portions 31.

In the illustrated embodiment, the first fixing member 40 and the second fixing member 50 are double-sided adhesive tapes. Shape of the fixing member 40 is the same as that of the fixing portion 32 of the support bracket 30. Shape of the second fixing member 50 is the same as that of the support portion 31 of the fixing bracket 30.

The housing 101 defines a mounting port 102 in a middle portion thereof. The top cover 21 of the keypad 20 is slidably received in the mounting port 102.

Figure 5:
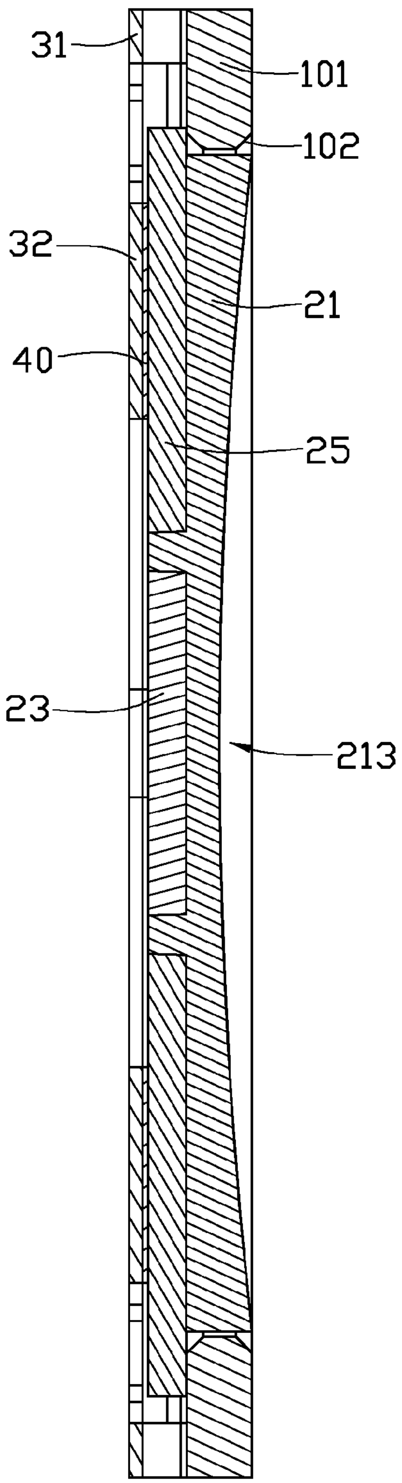
FIG. 5 is an enlarged cross-section taken along line V-V of FIG. 1.

Referring to FIGS. 1, 2 and 5, during assembly of the keypad assembly 103, the first fixing member 40 is fixed to the fixing portion 32 of the fixing bracket 30. Then, the fixing portion 32 of the fixing bracket 30 is fixed to the bottom cover 25 of the keycap 20. The filling portion 23 is received in the through hole 321 of the fixing bracket 30. The second fixing member 50 is fixed to the support portion 31, and the support portion 31 is fixed to the housing 101. The top cover 21 is received in the mounting port 102.

When the top cover 21 of the keycap 20 is depressed, the top cover 21 slides toward the mounting port 102 of the housing 101, such that the resilient portions 35 are elastically deformed. When the top cover 21 of the keycap 20 is released and returned the keycap 20 to its original position, each of the resilient portions 35 returns to a relaxed state and resists the keycap 20. Thereby, the resilient portions 35 can provide an elastic restoring force to the keycap 20, and without requiring any additional dedicated resilient member and protrusion to be located on the keycap 20, and the occupied volume of the keypad assembly 100 is thereby decreased.

It is to be understood that the first fixing member 40 and the second fixing member 50 can also be adhesive, threaded fasteners, or a plurality of latching structures. Two resilient portions 35 can also be used, and are asymmetrically fixed on a periphery of the fixing portion 32.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A keypad assembly comprising:

a keypad;

a fixing bracket; and a fixing member fixing the keypad to the fixing bracket, wherein the fixing bracket comprises two support portions, a fixing portion, two connecting portions and at least two resilient portions interconnecting the support portions and the fixing portions, opposites ends of each connecting portion interconnect the two support portion, such that the two connecting portions and the two support portions cooperatively form a frame, the fixing portion is located on a middle portion of the frame, the keycap fixes on the fixing portion, and the resilient portions are capable of elastically deforming and provides an elastic restoring force to the keycap.

2. The keypad assembly of claim 1, wherein the keypad comprises a top cover and a filling portion fixes on the top cover.

3. The keypad assembly of claim 2, wherein the top cover comprises an interface, a biasing surface opposite to the interface and a receiving frame located on a middle portion of the interface, and the filling portion is received in the receiving frame.

4. The keypad assembly of claim 3, wherein the biasing surface is a concave depression defined in a side surface of the top cover.

5. The keypad assembly of claim 3, wherein the keycap further comprises a bottom cover fixed on the interface, and the bottom cover defines a through hole in the center of the bottom cover to receive the receiving frame.

6. The keypad assembly of claim 1, wherein each connecting portion is substantially U-shaped, the two support portions and the connecting portions cooperatively form two stepped portions, and the resilient portions are protruded from a planar surface of the support portions.

7. The keypad assembly of claim 6, wherein the resilient portions are all substantially cap-shaped and fixed on a periphery of the fixing portion.

8. An electronic device comprising:

a housing defining a mounting port;

a keypad assembly located on the housing, the keypad assembly comprising:

a keypad received in the mounting port;

a fixing bracket;

a first fixing member fixing the keypad to the fixing bracket; and a second fixing member fixing the fixing bracket to the housing, wherein the fixing bracket comprises two support portions, a fixing portion, two connecting portions and at least two resilient portions interconnecting the support portions and the fixing portions, opposites ends of each connecting portion interconnect the two support portion, such that the two connecting portions and the two support portions cooperatively form a frame, the fixing portion is located on a middle portion of the frame, the keycap fixes on the fixing portion, and the resilient portions are capable of elastically deforming and provides an elastic restoring force to the keycap.

9. The electronic device of claim 8, wherein the keypad comprises a top cover and a filling portion fixed on the top cover.

10. The electronic device of claim 9, wherein the top cover comprises an interface, a biasing surface opposite to the interface and a receiving frame located on a middle portion of the interface, and the filling portion is received in the receiving frame.

11. The electronic device of claim 10, wherein the biasing surface is a concave depression defined in a side surface of the top cover.

12. The electronic device of claim 10, wherein the keycap further comprises a bottom cover fixed on the interface, and the bottom cover defines a through hole in the center of the bottom cover to receive the receiving frame.

13. The electronic device of claim 8, wherein each connecting portion is substantially U-shaped, the two support portions and the connecting portions cooperatively form two stepped portions, and the resilient portions are protruded from a planar surface of the support portions.

14. The electronic device of claim 13, wherein the resilient portions are all substantially cap-shaped and fixed on a periphery of the fixing portion.

15. The electronic device of claim 8, wherein the first fixing member and the second fixing member are double sided adhesive tapes.

* * * * *